(12) United States Patent
Khieu et al.

(10) Patent No.: US 9,336,953 B2
(45) Date of Patent: May 10, 2016

(54) MEMS LIFETIME ENHANCEMENT

(71) Applicant: CAVENDISH KINETICS INC., San Jose, CA (US)

(72) Inventors: Cong Quoc Khieu, San Jose, CA (US); Vikram Joshi, Mountain View, CA (US); Richard L. Knipe, McKinney, TX (US)

(73) Assignee: CAVENDISH KINETICS INC., San Jose, CA (US)

( * ) Notice: Subject to any disclaimer, the term of this patent is extended or adjusted under 35 U.S.C. 154(b) by 99 days.

(21) Appl. No.: 13/916,675

(22) Filed: Jun. 13, 2013

(65) Prior Publication Data
US 2013/0335878 A1      Dec. 19, 2013

Related U.S. Application Data

(60) Provisional application No. 61/659,498, filed on Jun. 14, 2012.

(51) Int. Cl.
*H01G 5/16* (2006.01)
*B81B 7/02* (2006.01)
*H01G 5/18* (2006.01)
*H01G 5/38* (2006.01)
*H01H 59/00* (2006.01)

(52) U.S. Cl.
CPC .. *H01G 5/16* (2013.01); *B81B 7/02* (2013.01); *H01G 5/18* (2013.01); *H01G 5/38* (2013.01); *H01H 59/0009* (2013.01)

(58) Field of Classification Search
CPC ...................................................... H01H 51/22
See application file for complete search history.

(56) References Cited

U.S. PATENT DOCUMENTS

| | | | | |
|---|---|---|---|---|
| 5,475,353 A | * | 12/1995 | Roshen et al. | 335/78 |
| 8,736,404 B2 | * | 5/2014 | Knipe et al. | 335/78 |
| 2003/0148550 A1 | * | 8/2003 | Volant et al. | 438/52 |
| 2005/0017313 A1 | * | 1/2005 | Wan | 257/415 |
| 2010/0116632 A1 | * | 5/2010 | Smith et al. | 200/181 |

FOREIGN PATENT DOCUMENTS

WO    WO-2010/054244 A2    5/2010
WO    WO-2012/040092 A1    3/2012

OTHER PUBLICATIONS

International search report and written opinion for PCT/US2013/045590 (CK084PCT) dated Oct. 22, 2013.

* cited by examiner

*Primary Examiner* — Mohamad Musleh
(74) *Attorney, Agent, or Firm* — Patterson & Sheridan, LLP

(57) ABSTRACT

The present invention generally relates to methods for increasing the lifetime of MEMS devices by reducing the number of movements of a switching element in the MEMS device. Rather than returning to a ground state between cycles, the switching element can remain in the same state if both cycles necessitate the same capacitance. For example, if in both a first and second cycle, the switching element of the MEMS device is in a state of high capacitance the switching element can remain in place between the first and second cycle rather than move to the ground state. Even if the polarity of the capacitance is different in successive cycles, the switching element can remain in place and the polarity can be switched. Because the switching element remains in place between cycles, the switching element, while having the same finite number of movements, should have a longer lifetime.

20 Claims, 2 Drawing Sheets

MEMS LIFETIME ENHANCEMENT

CROSS-REFERENCE TO RELATED APPLICATIONS

This application claims benefit of U.S. Provisional Patent Application Ser. No. 61/659,498, filed Jun. 14, 2012, which is herein incorporated by reference.

BACKGROUND OF THE INVENTION

1. Field of the Invention

Embodiments of the present invention generally relate to enhancing the lifetime of a micro-electromechanical system (MEMS) device.

2. Description of the Related Art

Digital variable capacitors (DVCs) utilizing MEMS technology operate by having a switching element of the MEMS device move between a state of high capacitance and a state of low capacitance. In a state of high capacitance, the switching element is in a position adjacent an RF electrode. In a state of low capacitance, the switching element is in a position adjacent to another electrode spaced from the RF electrode, or more specifically, away from an insulating layer that is disposed on the RF electrode. The switching element may also be moved to ground whereby the switching element is adjacent neither the RF electrode nor the other electrode.

During the lifetime of the MEMS device, the switching element cycles between the various states (i.e., high capacitance, low capacitance and ground). For a cycle, the switching element moves from the ground state to either the high or low capacitance state. After the cycle is completed, and before the next cycle, the switching element returns to the ground state. Then, a new cycle begins whereby the switching element moves to either a high or low capacitance state, or remains in the ground state.

There are only a finite number of times that the switching element can move before the MEMS device fails due to the structural integrity of the switching element. With each movement of the switching element, the MEMS device is closer to failure. There is a need in the art for increasing the lifetime of MEMS devices in DVCs.

SUMMARY OF THE INVENTION

The present invention generally relates to methods for increasing the lifetime of MEMS devices by reducing the number of movements of a switching element in the MEMS device. Rather than returning to a ground state between cycles, the switching element can remain in the same state if both cycles necessitate the same capacitance. For example, if in both a first and second cycle, the switching element of the MEMS device is in a state of high capacitance the switching element can remain in place between the first and second cycle rather than move to the ground state. Even if the polarity of the capacitance is different in successive cycles, the switching element can remain in place and the polarity can be switched. Because the switching element remains in place between cycles, the switching element, while having the same finite number of movements, should have a longer lifetime.

In one embodiment, a method of operating a DVC is disclosed. The DVC has a plurality of MEMS devices that each have a switching element. The method comprises a first switching process and a second switching process. The first switching process comprises switching a first MEMS device of the plurality of MEMS devices to first capacitance state. The switching comprises applying a first bias to a first electrode of the first MEMS device to move the switching element of the first MEMS device from a first position that is electrically grounded to a second position adjacent a second electrode of the first MEMS device. The first switching process also comprises switching a second MEMS device of the plurality of MEMS devices to a second state of capacitance. The switching comprises applying a second bias to a first electrode of the second MEMS device to move the switching element of the second MEMS device from a third position that is electrically grounded to a fourth position adjacent a second electrode of the second MEMS device. The switching the second MEMS device occurs simultaneous with the switching the first MEMS device. The second switching process comprises switching the first MEMS device to a ground state. The switching comprises removing the first bias to permit the switching element to return to first position. The second switching process also comprises maintaining the second bias on the first electrode of the second MEMS device to maintain the switching element of the second MEMS device in the third position while the first MEMS device returns to the first position.

In another embodiment, a method of operating a DVC is disclosed. The DVC has a plurality of MEMS devices that each have a switching element. The method comprises applying a first bias to a first electrode to move each switching element to a first position adjacent an RF electrode; applying a second bias to a second electrode to move each switching element to a second position spaced from the RF electrode; and applying a third bias to the first electrode to move less than all switching elements to the first position adjacent the RF electrode.

In another embodiment, a method of operating a DVC is disclosed. The DVC has a plurality of MEMS devices that each have a first electrode, a second electrode and a switching element. The method comprises applying a first bias to the first electrode of a first MEMS device to move the switching element of the first MEMS device to a first position adjacent the first electrode of the first MEMS device; removing the first bias to permit the switching element of the first MEMS device to move to a second position spaced a first distance from the first electrode of the first MEMS device; applying a second bias to the second electrode of the first MEMS device to move the switching element of the first MEMS device to a third position adjacent the second electrode of the first MEMS device; applying a third bias to the first electrode of a second MEMS device to move the switching element of the second MEMS device to the first position adjacent the first electrode of the first MEMS device; and maintaining the second bias to the second electrode to maintain the switching element in the third position while the third bias is applied to the first electrode of the second MEMS device.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

The present invention generally relates to methods for increasing the lifetime of MEMS devices by reducing the number of movements of a switching element in the MEMS device. Rather than returning to a ground state between cycles, the switching element can remain in the same state if both cycles necessitate the same capacitance. For example, if in both a first and second cycle, the switching element of the MEMS device is in a state of high capacitance the switching element can remain in place between the first and second cycle rather than move to the ground state. Even if the polarity of the capacitance is different in successive cycles, the switching element can remain in place and the polarity can be switched. Because the switching element remains in place between cycles, the switching element, while having the same finite number of movements, should have a longer lifetime.

Figure 1A:
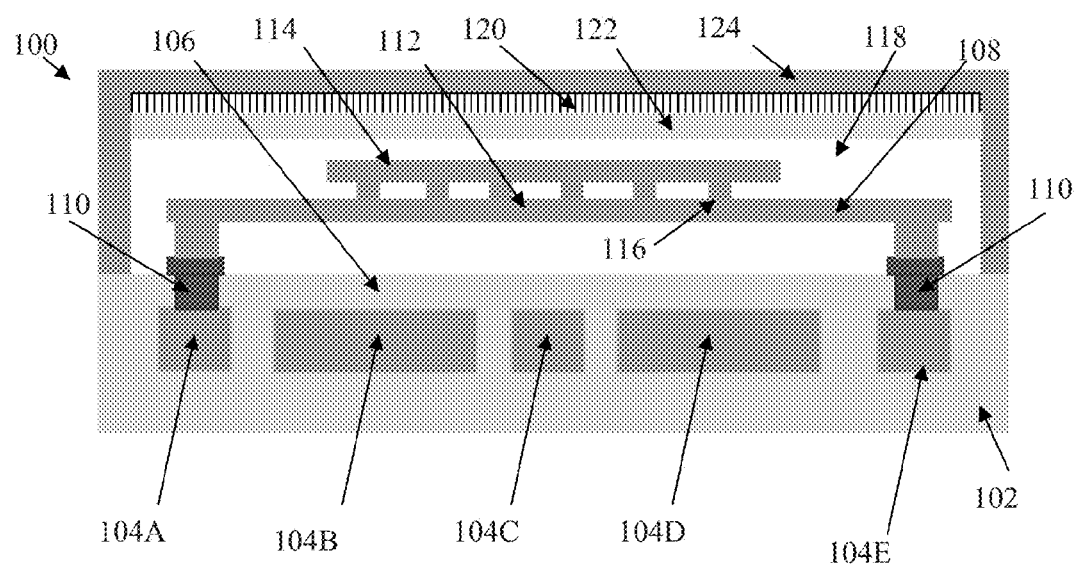
FIG. 1A shows a MEMS device in the ground state according to one embodiment.

FIG. 1A shows a MEMS device 100 in the ground state according to one embodiment. The MEMS device includes a substrate 102 having a plurality of electrodes 104A-104E formed therein. Two electrodes 104B, 104D are referred to as 'pull-in' electrodes because the electrodes 104B, 104D are used to pull the switching element 108 towards electrode 104C. Electrode 104C is an RF electrode. Electrodes 104A, 104E provide the ground connection to the switching element 108 through vias filled with electrically conductive material 110. An electrically insulating layer 106 is formed over the electrodes 104B-104D. In one embodiment, insulating layer 106 may comprise silicon dioxide, silicon nitride, or combinations thereof.

The switching element 108 may comprise an electrically conductive material such as titanium nitride. In one embodiment, the titanium nitride may be coated with a thin layer of electrically insulating material. The switching element 108 is shown to have a bottom layer 112 and a top layer 114 that are connected by one or more posts 116. It is to be understood that the switching element 108 is contemplated to have other arrangements as well. Additionally, it is to be understood that both the top and bottom layer 112, 114 of the switching element 108 are contemplated to comprise titanium nitride having a thin layer of electrically insulating material thereon, but other materials are contemplated as well. The switching element 108 is disposed within a cavity 118 and movable within the cavity 118 between the low capacitance, high capacitance and ground states.

Above the switching element, another electrode 120, sometimes referred to as a 'pull-up' or 'pull-off' electrode is present. A thin layer 122 of electrically insulating material is disposed between the electrode 120 and the cavity 118 such that the layer 122 bounds the cavity 118. The cavity 118 is sealed with a capping layer 124 that encapsulates the cavity 118.

Figure 1B:
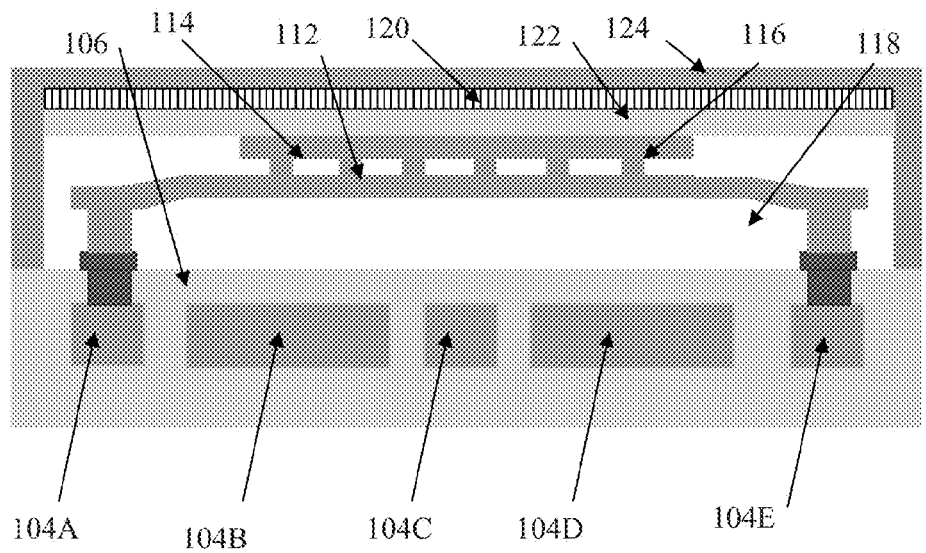
FIG. 1B shows the MEMS device of FIG. 1A in the low capacitance state according to one embodiment.

FIG. 1B shows the MEMS device 100 in the low capacitance state according to one embodiment. In FIG. 1B, electrode 120 is used to pull switching element 108 into contact with insulating layer 122, which is as far away from the RF electrode 104C as the switching element 108 can be within the cavity 118. The switching element 108 is pulled up into contact with insulating layer 122 by applying a bias to the pull-up electrode 120.

Figure 1C:
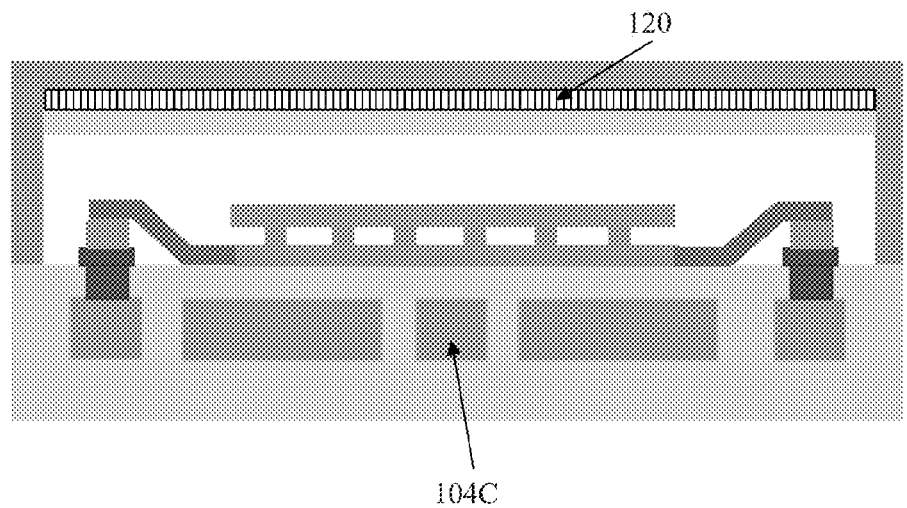
FIG. 1C shows the MEMS device of FIGS. 1A and 1B in the high capacitance state according to one embodiment.

FIG. 1C shows the MEMS device 100 in the high capacitance state according to one embodiment. The switching element 108 is pulled down into contact with insulating layer 106 and adjacent the RF electrode 104C by applying a bias to pull-in electrodes 104B, 104D.

If the insulating layer 122 is of thickness t between the pull-up electrode 120 and the switching element 108 when the switching element 108 is in the low capacitance state and the switching element 108 is 2 d away from the RF electrode 104C, then a voltage $V_{top}$ to the pull-up electrode 120 would provide an electrostatic pull-up force greater than a voltage $V_{RF}$ applied to RF electrode 104C if $$\frac{A_{top} \cdot V_{top}^{\varepsilon}}{(t/\varepsilon_r)^2} > \frac{A_{RF} \cdot V_{RF}^{\varepsilon}}{(2d)^2}$$

(where $\varepsilon_r$ is the relative dielectric for the top oxide which will be greater than 1). If t=d/2 then $V_{RF}$ would need to be at least 16 times $V_{top}$ to pull the cantilever back down if the area of electrode 120 ($A_{top}$)=the area of the RF electrode 104C ($A_{RF}$). In most cases the pull up area is also greater as it covers the whole roof of the cavity 118 and so covers most of the switching element 108, in which case the RF-voltage required to pull the switching element 108 back down would be increased even further.

A MEMS DVC uses a number of small fixed capacitors operating either full on (i.e., every MEMS device is in the high capacitance state, $C_{max}$) or full off (i.e., every MEMS device is in the low capacitance state, $C_{min}$). Various capacitance levels can be obtained by using combinations of these MEMS devices in a binary weighted fashion. The smallest collection of MEMS devices is considered the least significant bit (LSB) and the largest collection of switches the most significant bit (MSB). There are $2^n$ total levels of capacitance that can be created where n is the total number of bits.

Transition of the capacitor array from one capacitance state to the next, involves changing some or all of the bits. During operation, not all bits will be changed during a transition. In other words, in a first cycle, some of the MEMS devices will be in the high capacitance state, while others are in the low capacitance state or ground state. In the second cycle, some of the MEMS devices that were in the high capacitance state will be in the high capacitance state again, while other MEMS devices will be in a different state. The digital logic keeps track of whether a particular bit in the first cycle remains or changes state (i.e., low or high capacitance state), when moving to cycle 2. By only changing the bits required to achieve the desired state for cycle 2, the non changing bits remain stationary and thus don't accumulate life cycles. Statistically, this innovation will reduce the total number of bit cycles to ½ of the total number of state changes during the life of the MEMS device.

There are two elements for implementing the concept: controlling the MEMS devices bitwise and a finite state machine (FSM), which controls the switching of the MEMS devices. There are four factors about the MEMS switching control FSM. One factor is the initial condition which the FSM will set to a negative polarity for the very first capacitance value command. The second factor is special cases (e.g., power off or standby mode) where the FSM will reset all of the MEMS devices to the ground state so that the MEMS devices are in the free state. The third factor occurs during the DVC operation whereby if the capacitance value, oftentimes referred to as the bit value, is the same for two consecutive cycles, the FSM will keep the data (i.e., the FSM will hold the current state). The fourth factor occurs during the DVC operation whereby if the capacitance value is changed back to the same value in n+2 cycles, then the polarity of the MEMS electrode will be reversed.

Figure 2:
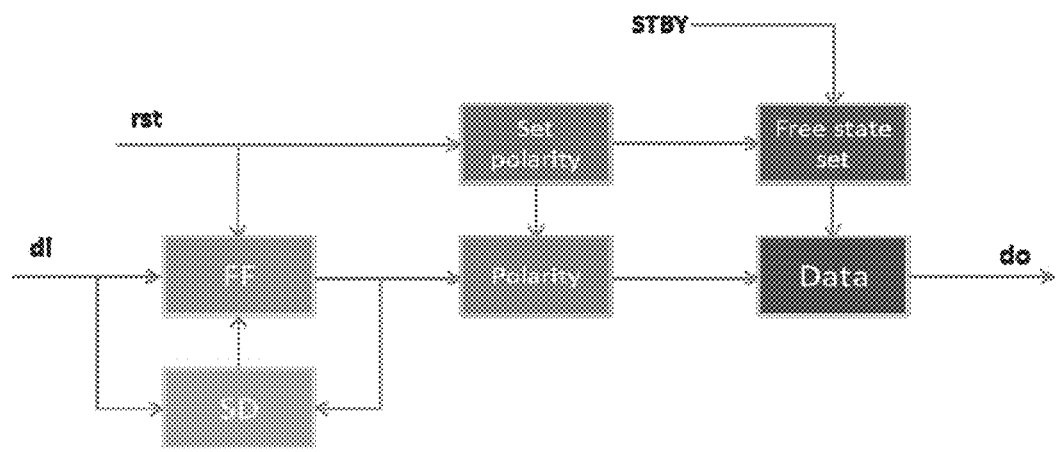
FIG. 2 is a block diagram of the MEMS switching control.

FIG. 2 is a block diagram showing the MEMS switching control FSM. Di is the input signal from the bump/pad. The input signal will be to either the pull-in electrodes 104B, 104D or to the pull-off electrode 120. Do is the output signal which drives the data bit for the MEMS device 100. The output signal is from the RF electrode 104C. SD is the look-ahead switching decision block. The decision block bases the decision based upon both the previous capacitance value (i.e., the state in which the MEMS device 100 is in at the end of cycle 1) and the capacitance value (i.e., the state in which the MEMS device 100 is in for cycle 2). The decision block determines whether to hold the data (i.e., maintain the switching element 108 of the MEMS device 100 in the same location) or to switch the data (i.e., move the switching element 108). The polarity is the block that toggles the polarity of the data that is based on the current cycle (i.e., cycle 1) and the forthcoming cycle (i.e., cycle 2). The set polarity block is the block that determines the initial value of the polarity (i.e., negative or positive). The data block is the data driver of the MEMS device 100. During the standby (i.e., STBY) mode, the data will be reset to ground (i.e., GND), so that the MEMS device 100 is in the free state.

Several examples will now be described which illustrate the operation of the MEMS device with switching control FSM.

Example 1

In the cycle 1, the MEMS device 100 is in the high capacitance state. In the high capacitance state, the pull-in electrodes 104B, 104D have a negative bias applied thereto and the pull-off electrode 120 is at ground potential. In cycle 2, the MEMS device 100 will be in the ground or standby state. In the ground or standby state, both the pull-in electrodes 104B, 104D and the pull-off electrode 120 will be at ground potential. In cycle 3, the MEMS device 100 will be in the high capacitance state while a positive bias is applied to the pull-in electrodes 104B, 104D and the pull-off electrode 120 is at ground potential. In cycle 4, the MEMS device 100 will be in the high capacitance state while a positive bias is applied to the pull-in electrodes 104B, 104D and the pull-off electrode 120 is at ground potential. Traditionally, in between cycles, the switching element 108 would move to the ground state from the high capacitance state. Then, when the next cycle begins, the switching element 108 would move (assuming a capacitance is required for the cycle). Therefore, in Example 1, even though the switching element 108 would be in the high capacitance state and the same polarity in both cycle 3 and cycle 4, the switching element 108 would traditionally move to the ground state between cycles under the traditional operation. Here, however, the switching control FSM will hold the switching element 108 in place between cycles 3 and 4 because the switching element 108 will be in the same location for both cycles. By not moving the switching element 108 between cycles, the switching element avoids moving away from the RF electrode 104C and then back to a position adjacent the RF electrode 104C. Thus, the switching cycle FSM has saved two movements of the switching element 108, which will increase the lifetime of the MEMS device 100.

Example 2

In the cycle 1, the MEMS device 100 is in the low capacitance state. In the low capacitance state, the pull-off electrode 120 has a negative bias applied thereto and the pull-in electrodes 104B, 104D are at ground potential. In cycle 2, the MEMS device 100 will be in the ground or standby state. In the ground or standby state, both the pull-in electrodes 104B, 104D and the pull-off electrode 120 will be at ground potential. In cycle 3, the MEMS device 100 will be in the low capacitance state while a positive bias is applied to the pull-off electrode 120 and the pull-in electrodes 104B, 104D are at ground potential. In cycle 4, the MEMS device 100 will be in the low capacitance state while a positive bias is applied to the pull-off electrode 120 and the pull-in electrodes 104B, 104D are at ground potential. Traditionally, in between cycles, the switching element 108 would move to the ground state from the low capacitance state. Then, when the next cycle begins, the switching element 108 would move (assuming a capacitance is required for the cycle). Therefore, in Example 2, even though the switching element 108 would be in the low capacitance state and the same polarity in both cycle 3 and cycle 4, the switching element 108 would traditionally move to the ground state between cycles. Here however, the switching control FSM will hold the switching element 108 in place between cycles 3 and 4 because the switching element 108 will be in the same location for both cycles. By not moving the switching element 108 between cycles, the switching element 108 avoids moving away from the pull-off electrode 120 and then back to a position adjacent the pull-off electrode 120. Thus, the switching cycle FSM has saved two movements of the switching element 108, which will increase the lifetime of the MEMS device 100.

Example 3

In the cycle 1, the MEMS device 100 is in the high capacitance state. In the high capacitance state, the pull-in electrodes 104B, 104D have a negative bias applied thereto and the pull-off electrode 120 is at ground potential. In cycle 2, the MEMS device 100 will be in the ground or standby state. In the ground or standby state, both the pull-in electrodes 104B, 104D and the pull-off electrode 120 will be at ground potential. In cycle 3, the MEMS device 100 will be in the low capacitance state while a negative bias is applied to the pull-off electrode 120 and the pull-in electrodes 104B, 104D are at ground potential. In cycle 4, the MEMS device 100 will be in the high capacitance state while a positive bias is applied to the pull-in electrodes 104B, 104D and the pull-off electrode 120 is at ground potential. Because the switching element 108 will need to move for each cycle, the switching cycle FSM will operate similar to the traditional switching and thus, there will be no lifetime increase for the MEMS device 100.

Example 4

In the cycle 1, the MEMS device 100 is in the low capacitance state. In the low capacitance state, the pull-off electrode 120 has a negative bias applied thereto and the pull-in electrodes 104B, 104D are at ground potential. In cycle 2, the MEMS device 100 will be in the ground or standby state. In the ground or standby state, both the pull-in electrodes 104B, 104D and the pull-off electrode 120 will be at ground potential. In cycle 3, the MEMS device 100 will be in the high capacitance state while a negative bias is applied to the pull-in electrodes 104B, 104D and the pull-off electrode 120 is at ground potential. In cycle 4, the MEMS device 100 will be in the low capacitance state while a positive bias is applied to the pull-off electrode 120 and the pull-in electrodes 104B, 104D are at ground potential. Because the switching element 108 will need to move for each cycle, the switching cycle FSM will operate similar to the traditional switching and thus, there will be no lifetime increase for the MEMS device 100.

Example 5

In the cycle 1, the MEMS device 100 is in the high capacitance state. In the high capacitance state, the pull-in electrodes 104B, 104D have a negative bias applied thereto and the pull-off electrode 120 is at ground potential. In cycle 2, the MEMS device 100 will be in the low capacitance state while a negative bias is applied to the pull-off electrode 120 and the pull-in electrodes 104B, 104D are at ground potential. In cycle 3, the MEMS device 100 will be in the high capacitance state while a positive bias is applied to the pull-in electrodes 104B, 104D and the pull-off electrode 120 is at ground potential. In cycle 4, the MEMS device 100 will be in the low capacitance state while a positive bias is applied to the pull-off electrode 120 and the pull-in electrodes 104B, 104D are at ground potential. Because the switching element 108 will need to move for each cycle, the switching cycle FSM will operate similar to the traditional switching and thus, there will be no lifetime increase for the MEMS device 100.

Example 6

In the cycle 1, the MEMS device 100 is in the low capacitance state. In the low capacitance state, the pull-off electrode 120 has a negative bias applied thereto and the pull-in electrodes 104B, 104D are at ground potential. In the cycle 2, the MEMS device 100 is in the high capacitance state. In the high capacitance state, the pull-in electrodes 104B, 104D have a negative bias applied thereto and the pull-off electrode 120 is at ground potential. In cycle 3, the MEMS device 100 will be in the low capacitance state while a positive bias is applied to the pull-off electrode 120 and the pull-in electrodes 104B, 104D are at ground potential. In cycle 4, the MEMS device 100 will be in the high capacitance state while a positive bias is applied to the pull-in electrodes 104B, 104D and the pull-off electrode 120 is at ground potential. Because the switching element 108 will need to move for each cycle, the switching cycle FSM will operate similar to the traditional switching and thus, there will be no lifetime increase for the MEMS device 100.

The Examples above have been described with reference to a single MEMS device. However, the embodiments described herein are applicable to a DVC that utilizes multiple MEMS devices. In operation of the DVC, some MEMS devices will be in the high capacitance state while others will be in either the low capacitance or ground state. Additionally, some of the MEMS devices will have a positive bias applied to the pull-off or pull-in electrodes while others will have a negative bias applied to the pull-off or pull-in electrodes. Thus, the Examples above may apply to each individual MEMS device within a DVC that have numerous MEMS devices.

Each MEMS device can be individually controlled within the DVC. Therefore, each MEMS device may operate at different capacitance states, and the pull-in electrodes and the pull-off electrodes of the MEMS devices may operate such that the polarity of the bias applied to the electrodes may be either positive or negative. In other words, a single MEMS device may operate in the high capacitance state by applying either a positive or a negative bias to the pull-in electrodes, and the polarity may be different for the high capacitance state in different cycles. Similarly, the MEMS device may operate in the low capacitance state by applying either a positive or negative bias to the pull-off electrode, and the polarity may be different for the low capacitance state in different cycles.

Additionally, by moving less than all of the MEMS devices, the DVC may operate at different capacitance levels. For example, if a plurality of MEMS devices share a common pull-in electrode, a common RF electrode and a common pull-off electrode, changing the bias to the pull-in electrode or the pull-off electrode will change the number of switching elements that move. The greater the bias applied, regardless of the polarity, the more switching elements will move. If less bias is applied, fewer switching elements may move.

By recognizing that the same capacitance state will apply to a MEMS device in successive cycles, the switching element of the MEMS device may remain in the same location in between cycles without moving to the ground position. Because the switching element does not move between cycles, the switching element has preserved two movements (i.e., movement to the ground position and movement back to the capacitance state position). Those preserved movements increase the lifetime of the MEMS device by two movements. One can easily see that applying such a strategy to all of the MEMS devices in a DVC could save millions of movements and thus extend the lifetime of the DVC.

While the foregoing is directed to embodiments of the present invention, other and further embodiments of the invention may be devised without departing from the basic scope thereof, and the scope thereof is determined by the claims that follow.

The invention claimed is:

1. A method of operating a digital variable capacitor, the digital variable capacitor having a plurality of MEMS devices that each have a switching element, the method comprising:
    a first switching process comprising:
        switching a first MEMS device of the plurality of MEMS devices to first capacitance state, the switching comprising applying a first bias to a first electrode of the first MEMS device to move the switching element of the first MEMS device from a first position that is electrically grounded to a second position adjacent a second electrode of the first MEMS device; and
        switching a second MEMS device of the plurality of MEMS devices to a second state of capacitance, the switching comprising applying a second bias to a first electrode of the second MEMS device to move the switching element of the second MEMS device from a third position that is electrically grounded to a fourth position adjacent a second electrode of the MEMS device, the switching the second MEMS device occurring simultaneous with the switching the first MEMS device; and
    a second switching process comprising:
        switching the first MEMS device to a ground state, the switching comprising removing the first bias to permit the switching element to return to first position; and
        maintaining the second bias on the first electrode of the second MEMS device to maintain the switching element of the second MEMS device in the fourth position while the first MEMS device returns to the first position.

2. The method of claim 1, wherein the first state of capacitance and the second state of capacitance are the same.

3. The method of claim 2, wherein the first bias and the second bias have the same polarity.

4. The method of claim 2, wherein the first bias and the second bias have opposite polarities.

5. The method of claim 1, wherein the first state of capacitance and the second state of capacitance are different.

6. The method of claim 5, wherein the first bias and the second bias have the same polarity.

7. The method of claim 5, wherein the first bias and the second bias have opposite polarities.

8. The method of claim 1, wherein the first switching process further comprises maintaining a third MEMS device in a fifth position that is electrically grounded, the maintaining occurring simultaneous with the switching the first MEMS device and switching the second MEMS device.

9. The method of claim 8, wherein the second switching process further comprises switching the third MEMS device to third capacitance state by applying a third bias to a first electrode of the third MEMS device to move the switching element of the third MEMS device from the fifth position to a sixth position adjacent a second electrode of the third MEMS device.

10. The method of claim 9, wherein the third state of capacitance and the first state of capacitance are different.

11. The method of claim 10, wherein the second state of capacitance and the third state of capacitance are the same.

12. The method of claim 11, wherein the second bias and the third bias have opposite polarities.

13. A method of operating a digital variable capacitor, the digital variable capacitor having a plurality of MEMS devices that each have a switching element, the method comprising:
applying a first bias to a first electrode to move each switching element to a first position adjacent an RF electrode;
applying a second bias to a second electrode to move each switching element to a second position spaced from the RF electrode; and
applying a third bias to the first electrode to move less than all switching elements to the first position adjacent the RF electrode.

14. The method of claim 13, wherein the first bias is greater than the third bias.

15. The method of claim 14, wherein the digital variable capacitor has a first capacitance when all of the switching elements are in the first position, a second capacitance when all of the switching elements are in the second position and a third capacitance when the third bias is applied and wherein the first capacitance is greater than the second capacitance and the third capacitance.

16. The method of claim 15, further comprising removing the first bias when applying the second bias.

17. The method of claim 16, further comprising removing the second bias when applying the third bias.

18. A method of operating a digital variable capacitor, the digital variable capacitor having a plurality of MEMS devices that each have a first electrode, a second electrode and a switching element, the method comprising:
applying a first bias to the first electrode of a first MEMS device to move the switching element of the first MEMS device to a first position adjacent the first electrode of the first MEMS device;
removing the first bias to permit the switching element of the first MEMS device to move to a second position spaced a first distance from the first electrode of the first MEMS device;
applying a second bias to the second electrode of the first MEMS device to move the switching element of the first MEMS device to a third position adjacent the second electrode of the first MEMS device;
applying a third bias to the first electrode of a second MEMS device to move the switching element of the second MEMS device to the first position adjacent the first electrode of the first MEMS device; and
maintaining the second bias to the second electrode to maintain the switching element in the third position while the third bias is applied to the first electrode of the second MEMS device.

19. The method of claim 18, wherein the first bias and the third bias have the same polarity.

20. The method of claim 18, wherein the first bias and the third bias have opposite polarities.

* * * * *